(12) United States Patent
Song et al.

(10) Patent No.: US 10,918,255 B2
(45) Date of Patent: Feb. 16, 2021

(54) CLEANING ROBOT

(71) Applicant: LG ELECTRONICS INC., Seoul (KR)

(72) Inventors: Hyunsup Song, Seoul (KR); Jongil Park, Seoul (KR); Jongjin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 237 days.

(21) Appl. No.: 15/858,652

(22) Filed: Dec. 29, 2017

(65) Prior Publication Data

US 2018/0184874 A1    Jul. 5, 2018

(30) Foreign Application Priority Data

Dec. 30, 2016   (KR) .................. 10-2016-0184322

(51) Int. Cl.
*A47L 11/40*     (2006.01)
*G01R 33/07*     (2006.01)

(52) U.S. Cl.
CPC .......... *A47L 11/4061* (2013.01); *G01R 33/07* (2013.01); *A47L 2201/04* (2013.01)

(58) Field of Classification Search
CPC ...... A47L 9/009; B60R 21/0136; G01R 33/07
USPC ........................................................... 15/319
See application file for complete search history.

(56) References Cited

U.S. PATENT DOCUMENTS

| | | | |
|---|---|---|---|
| 6,481,515 B1 * | 11/2002 | Kirkpatrick | A47L 11/03 180/65.1 |
| 6,941,199 B1 * | 9/2005 | Bottomley | G05D 1/0221 701/23 |
| 6,999,850 B2 * | 2/2006 | McDonald | A47L 9/009 318/567 |
| 2007/0032904 A1 * | 2/2007 | Kawagoe | G05D 1/0219 700/245 |
| 2010/0037418 A1 * | 2/2010 | Hussey | A47L 5/30 15/319 |

* cited by examiner

*Primary Examiner* — Brian D Keller
*Assistant Examiner* — Thomas Raymond Rodgers
(74) *Attorney, Agent, or Firm* — Birch, Stewart, Kolasch & Birch, LLP

(57) ABSTRACT

A cleaning robot, which performs cleaning operation while moving, includes a cover, to which external force is applied, a movement frame fastened to the cover, a fixed body provided in the cover, a traveling unit connected to the fixed body, and an elasticity setting part configured to movably support the movement frame to the fixed body, wherein the elasticity setting part includes a sensor configured to sense movement of the movement frame.

18 Claims, 11 Drawing Sheets

RETURNS TO REFERENCE POSITION

CLEANING ROBOT

CROSS-REFERENCE TO RELATED APPLICATIONS

This application claims priority under 35 U.S.C. 119 and 365 to Korean Patent Application No. 10-2016-0184322, filed on Dec. 30, 2016 in the Korean Intellectual Property Office, the disclosure of which is incorporated herein by reference.

FIELD

The present invention relates to a cleaning robot for performing cleaning operation while traveling about a specific place such as an airport.

BACKGROUND

Recently, with development of autonomous traveling technology and automatic control technology, functions of a traveling device and, more particularly, a robot have been increased.

Each technology will now be described. Autonomous traveling technology refers to technology for enabling a machine to autonomously move to avoid an obstacle. According to autonomous traveling technology, a robot autonomously recognizes a position thereof through a sensor and moves to avoid an obstacle.

Automatic control technology refers to technology for enabling a machine to feed values measured by examining the state of the machine back to a control device to automatically control operation of the machine. Accordingly, the machine can be controlled without human manipulation and can be automatically controlled to be positioned within a target range, that is, to reach a target point.

With development and combination of the above-described technologies, an intelligent robot can be implemented and a variety of information and services can be provided through the intelligent robot.

The robot is generally applicable to industrial fields, medical fields, space-related fields and ocean-related fields. For example, a robot may perform repeated operation in machining processes such as automobile production. That is, when a person inputs an operation to be performed, industrial robots repeat the received operation.

In addition, technology for mounting a camera in a robot was conventionally implemented. A robot may recognize a position thereof or an obstacle using a camera. In addition, a captured image can be displayed on a display unit.

SUMMARY

An object of the present embodiment is to provide a cleaning robot capable of sensing collision with an obstacle or application of external force.

Another object of the present embodiment is to provide a cleaning robot capable of controlling a traveling speed or direction when collision with an obstacle or application of external force to prevent internal components from being damaged or broken.

According to an aspect of the present embodiment, a cleaning robot includes a cover forming appearance of the cleaning robot, a movement frame fastened to the cover, and an elasticity setting part provided in a fixed body, connected to the movement frame and including a sensor for sensing movement of the cover due to external force.

In order to sense movement of the cover or the movement frame, the elasticity setting part may include a Hall sensor. The movement frame may be connected to a magnetic material and the magnetic material may also move according to movement of the movement frame by the external force. The Hall sensor may sense change in magnetic field by movement of the magnetic material.

According to another aspect of the present embodiment, a controller of a cleaning robot may recognize that external force is applied to a cover based on change in magnetic field sensed by the Hall sensor. Upon recognizing that external force is applied to the cover, the controller may control a traveling unit to change traveling properties, such as a traveling speed or direction, of the cleaning robot.

Accordingly, a cleaning robot according to the invention may include a fixed body, a traveling part provided at a lower portion of the fixed body to enable the cleaning robot to move along a floor surface, a suction part provided at the fixed body to suck foreign materials from the floor surface, a cover surrounding the fixed body, the cover being configured to receive an external force, a movement frame supporting the cover, the movement frame being movable horizontally with respect to the fixed body, at least one elasticity setting part provided between the movement frame and the fixed body to support the movement frame relative to the fixed body, and to permit limited movement of the cover with respect to the fixed body, and a sensor configured to sense movement of the movement frame.

The traveling part may include a plurality of wheels.

The sensor may include a Hall effect sensor. The cleaning robot may include a magnetic material connected to the movement frame. The cleaning robot may include a magnetic-material fixing part extending from a lateral side of the movement frame to fix the magnetic material to the movement frame. The magnetic-material fixing part positions the magnetic material at a vertically upper side of the Hall effect sensor. The magnetic material moves adjacent to an upper side of the Hall effect sensor when the cover moves by the external force.

The cleaning robot may include a controller configured to recognize that the external force is applied to the cover based on a sensed result of the sensor, wherein the controller controls the traveling unit to change traveling properties of the cleaning robot when the external force is applied.

The cover forms an external appearance of the cleaning robot.

The at least one elasticity setting part may include a plate provided on the fixed body, an inner body contacting an upper surface of the plate, and a movement shaft connecting the movement frame to the inner body, wherein the inner body is horizontally movable with respect to the plate.

The inner body may horizontally move according to external force applied to the cover.

The at least one elasticity setting part may include a first elasticity setting part provided at a front side of the fixed body, a second elasticity setting part provided at a left rear portion of the fixed body, and a third elasticity setting part provided at a right rear portion of the fixed body, wherein the first, second and third elasticity setting parts are arranged in a triangular shape.

Each of the first, second and third elasticity setting parts may comprise a first elastic member connected between the movement frame and the fixed body for biasing the movement frame in a first direction, and a second elastic member connected between the movement frame and the fixed body for biasing the movement frame in a second direction.

The first elasticity setting part may include a first plate portion provided at a front portion of the fixed body, a first inner body contacting an upper surface of the first plate portion, and a first movement shaft connecting the movement frame to the first inner body, wherein the second elasticity setting part comprises a second plate portion provided at a left rear portion of the fixed body, a second inner body contacting an upper surface of the second plate portion, and a second movement shaft connecting the movement frame to the second inner body, wherein the third elasticity setting part comprises a third plate portion provided at a right rear portion of the fixed body; a third inner body contacting an upper surface of the third plate portion, and a third movement shaft connecting the movement frame to the third inner body, and wherein the first, second and third inner bodies are arranged in a triangular shape.

The at least one elasticity setting part may further include a first elastic member connected between the movement frame and the fixed body for biasing the movement frame in a first direction, and a second elastic member connected between the movement frame and the fixed body for biasing the movement frame in a second direction. The second direction is generally orthogonal to the first direction.

Vector components of forces provided by the first elastic member and the second elastic member sum together in a front-to-rear direction of the cleaning robot so that the movement frame is biased toward a front of the cleaning robot, and offset each other in a side-to-side direction of the cleaning robot so that the movement frame is biased toward an intermediate position between a right side and a left side of the cleaning robot.

The cleaning robot may include a side brush protruding from a front lower end of the cover.

Also, a cleaning robot according to the invention a fixed body, a traveling part provided at a lower portion of the fixed body to enable the cleaning robot to move along a floor surface, a suction part provided at the fixed body to suck foreign materials from the floor surface, a cover surrounding the fixed body, the cover being configured to receive an external force, at least one elasticity setting part provided between the cover and the fixed body to support the cover relative to the fixed body, and to permit limited horizontal movement of the cover with respect to the fixed body, the at least one elasticity setting part comprising a sensor for sensing movement of the cover.

Finally, a cleaning robot according to the invention may include a fixed body, a plurality of wheels provided at a lower portion of the fixed body to enable the cleaning robot to move along a floor surface, a suction part provided at the fixed body to suck foreign materials from the floor surface, a cover surrounding the fixed body, the cover being configured to receive an external force, a movement frame supporting the cover, the movement frame being movable horizontally with respect to the fixed body, at least one elasticity setting part provided between the movement frame and the fixed body to support the movement frame relative to the fixed body, and to permit limited movement of the cover with respect to the fixed body, the at least one elasticity setting part comprising a plate provided on the fixed body, an inner body contacting an upper surface of the plate, a movement shaft connecting the movement frame to the inner body, a first elastic member connected between the movement frame and the fixed body for biasing the movement frame in a first direction, and a second elastic member connected between the movement frame and the fixed body for biasing the movement frame in a second direction, a sensor configured to sense movement of the movement frame, and a controller configured to recognize that the external force is applied to the cover based on a sensed result of the sensor, wherein the controller controls the plurality of wheels to change traveling properties of the cleaning robot when the external force is applied.

DETAILED DESCRIPTION OF THE PREFERRED EMBODIMENT

A traveling device refers to a device which can move from a specific position to another position using power. The traveling device may be divided into an automatic traveling device and a manual traveling device. The automatic traveling device may refer to a traveling device which autonomously travels along a predetermined path without user manipulation. As an example of the traveling device, there is a movable robot. The movable robot may perform various operations while moving using traveling parts, e.g., wheels or legs.

For convenience of description, in this specification, the present invention will be described using a cleaning robot. The cleaning robot may mean a robot for performing cleaning operation while moving about a specific region. For example, the cleaning robot may include an airport cleaning robot for performing cleaning operation while moving about a wide space such as an airport.

The present invention is not limited to the cleaning robot and is applicable to a traveling device including a cleaning robot.

Figure 1:
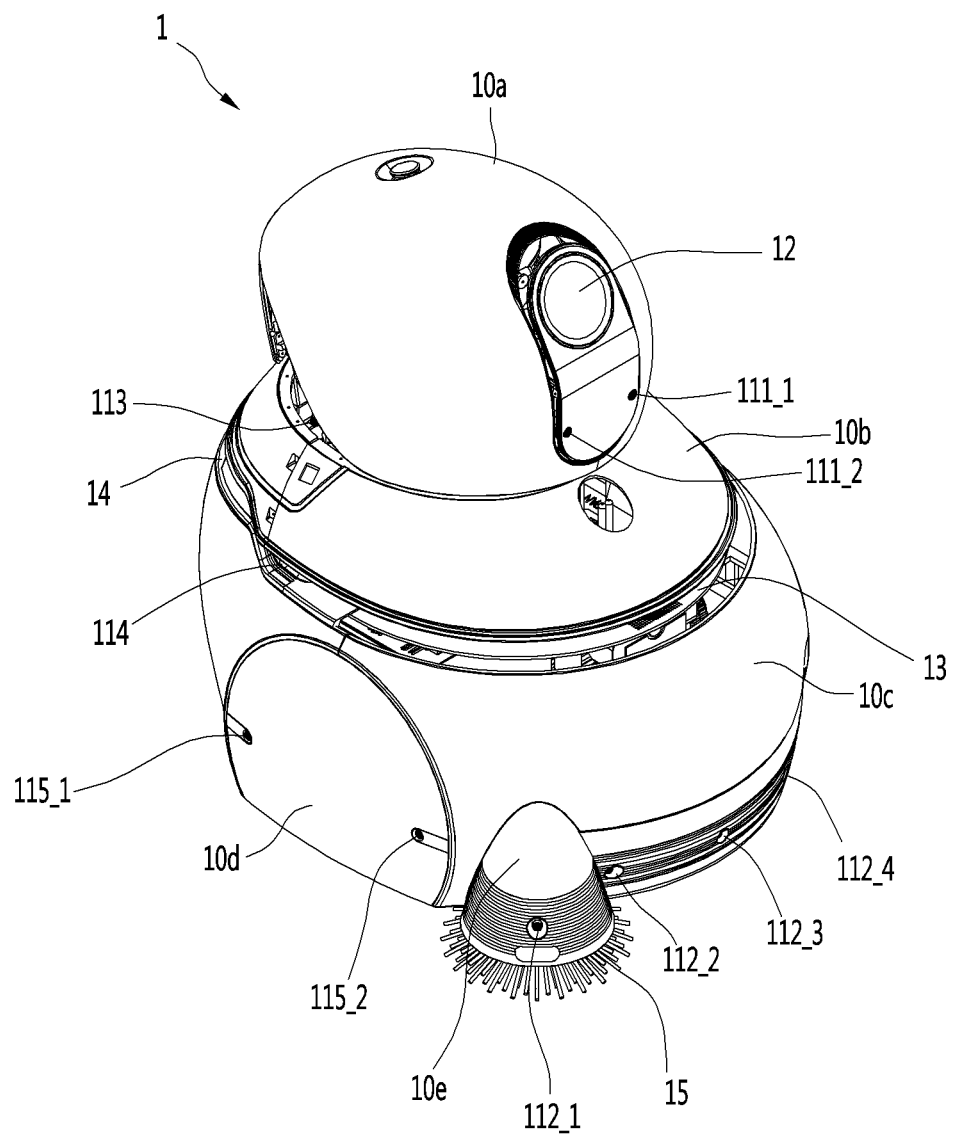
FIG. 1 is a diagram showing the appearance of a cleaning robot according to an embodiment of the present invention.

FIG. 1 is a diagram showing the appearance of a cleaning robot according to an embodiment of the present invention.

Figure 2:
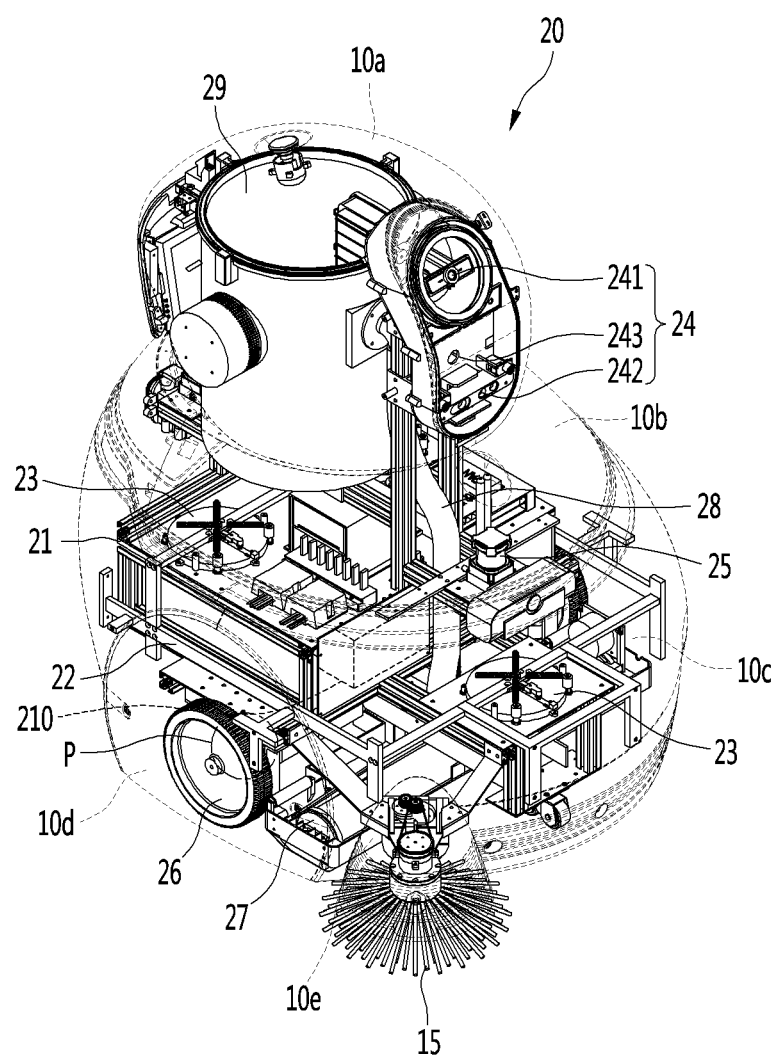
FIG. 2 is a perspective view showing a main body provided in a cleaning robot according to an embodiment of the present invention.

Referring to FIG. 1, the cleaning robot 1 includes covers 10a, 10b, 10c, 10d and 10e (collectively, 10) covering various components provided in a main body 20 (see FIG. 2). The cover 10 surrounds the outside of the main body 20 to form the appearance of the cleaning robot 1.

For example, the cover 10 may include a top cover 10a, a middle cover 10b provided below the top cover 10a and a bottom cover 10c provided below the middle cover 10b. The top cover 10a, the middle cover 10b and the bottom cover 10c may be integrally formed as one cover or may be separately formed as separate covers.

The top cover 10a may be located at the uppermost end of the cleaning robot 1. For example, the top cover 10a may be formed in a dome shape, without being limited thereto. The top cover 10a may include a light transmission unit 12 for enabling at least one camera provided in the main body 20 to capture the periphery (e.g., the front side) of the cleaning robot 1. The light transmission unit 12 may be placed at one side of a front surface of the top cover 10a. The light transmission unit 12 may be made of a material for transmitting light, such as glass, plastic, acryl, etc., without being limited thereto. The at least one camera may collect light reflected from objects located near the cleaning robot 1 and received through the light transmission unit 12, thereby capturing the objects located near the cleaning robot 1. For example, at least one camera may be used to recognize the face of a user or an obstacle located at the front side of the cleaning robot 1 or to sense the current position of the cleaning robot. The top cover 10a may be located at a height where the at least one camera can recognize the user's face or more accurately recognize the current position of the cleaning robot. For example, the top cover 10a may be located at a height (e.g., about 140 cm) less than the height of an adult.

The middle cover 10b may be provided below the top cover 10a. The width of the middle cover 10b may be gradually increased from the upper side to the lower side thereof. For example, if the middle cover 10b has a cylindrical shape, the diameter of the middle cover 10b may be increased from the upper side to the lower side thereof. In some embodiments, the middle cover 10b may be included in the top cover 10a. In this case, the cover 10 may be divided into a top cover (or a first cover) and a bottom cover (or a second cover) with respect to recessed parts 13 and 14.

The bottom cover 10c may be provided below the middle cover 10b. The bottom cover 10c may have a greater width than the top cover 10a and the middle cover 10b.

A battery, traveling parts (e.g., wheels), various boards (e.g., printed circuit boards (PCBs)), etc. may be received in the bottom cover 10c. In some embodiments, the bottom cover 10c may be formed to surround the outsides of the traveling parts 26 (see FIG. 2). In another embodiment, the bottom cover 10c may include traveling-unit covers 10d surrounding the outsides of the traveling parts 26. In another embodiment, if a side brush 15 protruding to a front lower end of the cleaning robot 1 is provided, the bottom cover 10c may be formed to surround the outside of the side brush 15. In some embodiments, the bottom cover 10c may further include a side-brush cover 10e surrounding the outside of the side brush 15.

The cover 10 may include a plurality of sensors 111_1 to 115_2 (collectively referred to as a sensor unit 11) for sensing whether an object is present within a predetermined distance from the cleaning robot 1. The sensor unit 11 may be provided at various positions of the top cover 10a, the middle cover 10b and the bottom cover 10c.

Meanwhile, the cover 10 may include a first recessed part 13 and a second recessed part 14. The first recessed part 13 and the second recessed part 14 may be recessed from the outside of the cover 10 to the inside of the robot. The top cover 10a and the middle cover 10b are positioned above the first recessed part 13 and the second recessed part 14 and the bottom cover 10c may be positioned below the first recessed part 13 and the second recessed part 14.

In particular, the cover 10 according to the embodiment of the present invention may be included in the main body 20 (see FIG. 2) of the cleaning robot 1 and may serve as a bumper for protecting various components connected to the fixed body 21 (see FIG. 2) from external impact. To this end, since the cover 10 is not directly connected to the fixed body 21 of the cleaning robot 1, it is possible to minimize movement of the fixed body 21 and the various components connected to the fixed body 21 when the cover 10 is moved by external impact.

Figure 3:
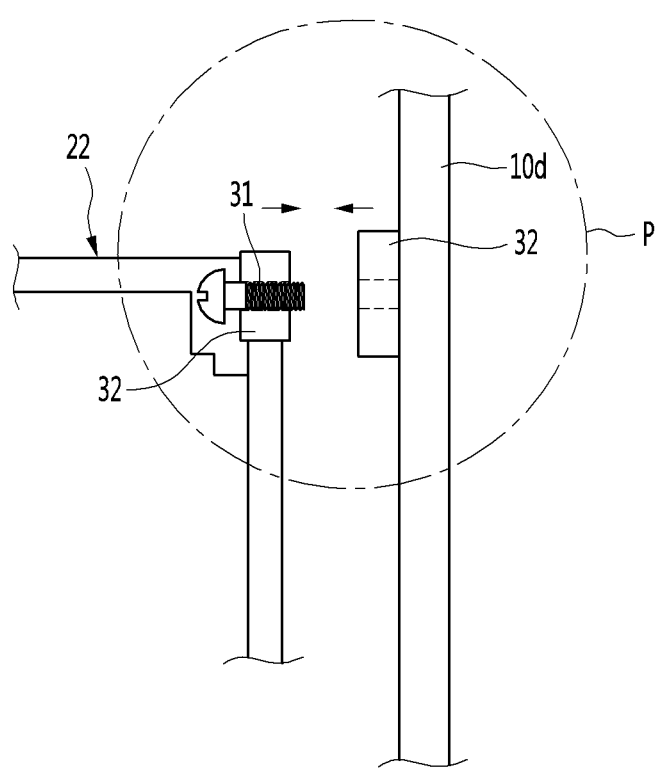
FIG. 3 is a diagram showing an example of a fastening structure between a cover and a movement frame of a cleaning robot according to an embodiment of the present invention.

FIG. 2 is a perspective view showing a main body provided in a cleaning robot according to an embodiment of the present invention, and FIG. 3 is a diagram showing an example of a fastening structure between a cover and a movement frame of a cleaning robot according to an embodiment of the present invention.

Referring to FIGS. 2 and 3, the main body 20 of the cleaning robot 1 may include a fixed body 21, a movement frame 22, one or more elasticity setting parts 23 and traveling parts 26. The components shown in FIG. 2 are not essential in implementation of the main body 20 of the cleaning robot 1. Accordingly, the main body 20 of the cleaning robot 1 described in this specification may have more or fewer components than the above-described components.

Specifically, among the above-described components, the fixed body 21 may be connected to various parts necessary for operation of the cleaning robot 1 and the other components. In this specification, the fixed body 21 may be a frame configuring the main body 20. The fixed body 21 may be received in the bottom cover 10c. That is, the cover 10 may be formed to surround the outside of the fixed body 21.

The fixed body 21 may include various boards for controlling overall operation of the cleaning robot 1. For example, the fixed body 21 may include some or all of a main board for managing overall driving of the cleaning robot 1, a board for processing data collected through the sensor unit 11, the camera unit 24 and the lidar sensor 25 and/or a board for controlling operation for supplying power of the battery 210 to the components included in the cleaning robot 1. The battery 210 may be located in the fixed body 21. The battery 210 may provide power necessary for operation of the cleaning robot 1 to various components.

In addition, the fixed body 21 may be connected to various components (e.g., a lidar sensor 25 and the traveling unit 26) necessary for operation of the cleaning robot 1. The detailed structure of the fixed body 21 will be described below with reference to FIG. 4.

The movement frame 22 is provided between the cover 10 and the fixed body 21 to support the cover 10 movably relative to the fixed body 21. The movement frame 22 may be fastened to at least one point P of the cover 10 to support the cover 10 relative to the fixed body 21 while moving according to movement of the cover 10. For example, as shown in FIG. 3, the cover 10 (e.g., traveling-unit cover 10d) located at a fastening point P or the movement frame 22 may include a fastening boss 32 such that the cover 10 and the movement frame 22 are fastened to each other by a fastening screw 31 and the fastening boss 32. In some embodiments, the cover 10 or the movement frame 22 may include a plurality of fastening bosses such that the cover 10 and the movement frame 22 are fastened to each other at a plurality of points. The method of fastening the cover 10 and the movement frame 22 is not limited to the embodiment shown in FIG. 3 and various fastening methods may be used.

As described above with reference to FIG. 1, if the cover 10 includes the top cover 10a, the middle cover 10b and the bottom cover 10c (the bottom cover 10c includes the traveling-unit cover 10d), the movement frame 22 may be fastened to the bottom cover 10c and may not be fastened to the top cover 10a and the middle cover 10b. Accordingly, the movement frame 22 may move based on movement of the bottom cover 10c. However, in some embodiments, the movement frame 22 may be fastened to the top cover 10a or the middle cover 10b and, in this case, the movement frame 22 may move based on movement of the top cover 10a or the middle cover 10b.

In addition, the movement frame 22 may be connected to the fixed body 21 through the one or more elasticity setting parts 23 and, at the same time, may be supported relative to the fixed body 21. That is, since the movement frame 22 and the cover 10 are connected to the fixed body 21 through the one or more elasticity setting parts 23, the one or more elasticity setting parts 23 may be provided as fasteners between the cover 10 and the fixed body 21.

The one or more elasticity setting parts 23 may minimize delivery of external force to the fixed body 21 using an elastic member (e.g., a spring, etc.) having elastic force, even when the cover 10 and the movement frame 22 are moved by external force. That is, the elastic member may absorb external force applied to the cover 10 as elastic deformation. Accordingly, even when the cover 10 and the movement frame 22 are moved by external force, the fixed body 21 is not moved, thereby preventing various components connected or fixed to the fixed body 21 from being damaged or broken. In particular, since the elastic setting parts 23 are fixed to the fixed body 21 including a component having a large weight, such as the battery 210, the fixed body 21 may not be moved and only the elastic member may be stretched, upon applying external force. That is, the elasticity setting parts 23 may support the cover 10 and the movement frame 22 to move independently of the fixed body 21.

In addition, the one or more elasticity setting parts 23 may include a sensor for sensing movement of the cover 10 and the movement frame 22 upon applying external force. For example, the sensor may be implemented by a Hall effect sensor that varies its output voltage in response to a magnetic field (Hall sensor) without being limited thereto. The sensor will be described in greater detail with reference to FIGS. 4 and 5.

According to the embodiment of FIG. 5 to be described later, the main body 20 may include a first elasticity setting part 23a, a second elasticity setting part 23b, and a third elasticity setting part 23c respectively provided at the front side and lateral rear sides of the fixed body 21. The first to third elasticity setting parts 23a to 23c provided in the fixed body 21 may be arranged in a triangular shape when viewed from the top of the cleaning robot 1. Accordingly, the cover 10 and the movement frame 22 may be stably supported relative to the fixed body 21 by the first to third elasticity setting parts 23a to 23c.

The traveling parts 26 may be provided below the fixed body 21. For example, the traveling parts 26 may be connected to a lower fixed body 21e (referring to FIG. 4). Although wheels 26 are shown as an example of the traveling parts 26 in FIG. 2, the traveling parts 26 may include legs in another embodiment. In addition, although two wheels are provided at both sides of the cleaning robot in this specification, the number of wheels may be variously changed. The wheels 26 rotate based on rotation force applied by a driving unit (not shown), such that the cleaning robot 1 travels. In some embodiments, a caster for aiding traveling of the cleaning robot 1 may be provided at the front or rear side of the cleaning robot 1.

In some embodiments, the cleaning robot 1 may further include a side brush 15 protruding to the front lower end of the cleaning robot, a camera unit 24 for capturing the front side of the cleaning robot, a lidar sensor 25 for sensing an object located in the front direction of the cleaning robot 1, a suction module 27 for sucking in foreign materials on the ground, a cleaning module 29 for collecting the sucked foreign materials and a suction pipe 28 provided between the suction module 27 and the cleaning module 29. For example, the camera unit 24 may include a simultaneous localization and mapping (SLAM) camera 241, a red, green, blue, distance (RGBD) camera 242, and a stereo camera (or stereoscopic camera 243. The suction module 27 may further a driving motor for rotating an agitator and a timing belt. The cleaning module 29 may include a dust collection motor and a dust collector.

Using the various components of the main body 20 described with reference to FIG. 2, the cleaning robot 1 may perform cleaning operation while freely moving about a region of a specific place (e.g., an airport, etc.).

As described above, various components are included in the main body 20 of the cleaning robot 1. The cover 10 (more particularly, the bottom cover 10c) forming the appearance of the cleaning robot 1 may serve as a bumper for protecting the various components included in the main body 20 from external impact (e.g., collision with an obstacle, external force, etc.) occurring at various positions or in various directions. In order for the bottom cover 10c to serve as a bumper, the movement frame 22 may be fastened to the bottom cover at least one point and connected to and supported by the fixed body 21 at at least one point through the one or more elastic setting parts 23.

Hereinafter, the fixed body 21 provided in the main body 20 will be described in greater detail.

Figure 4:
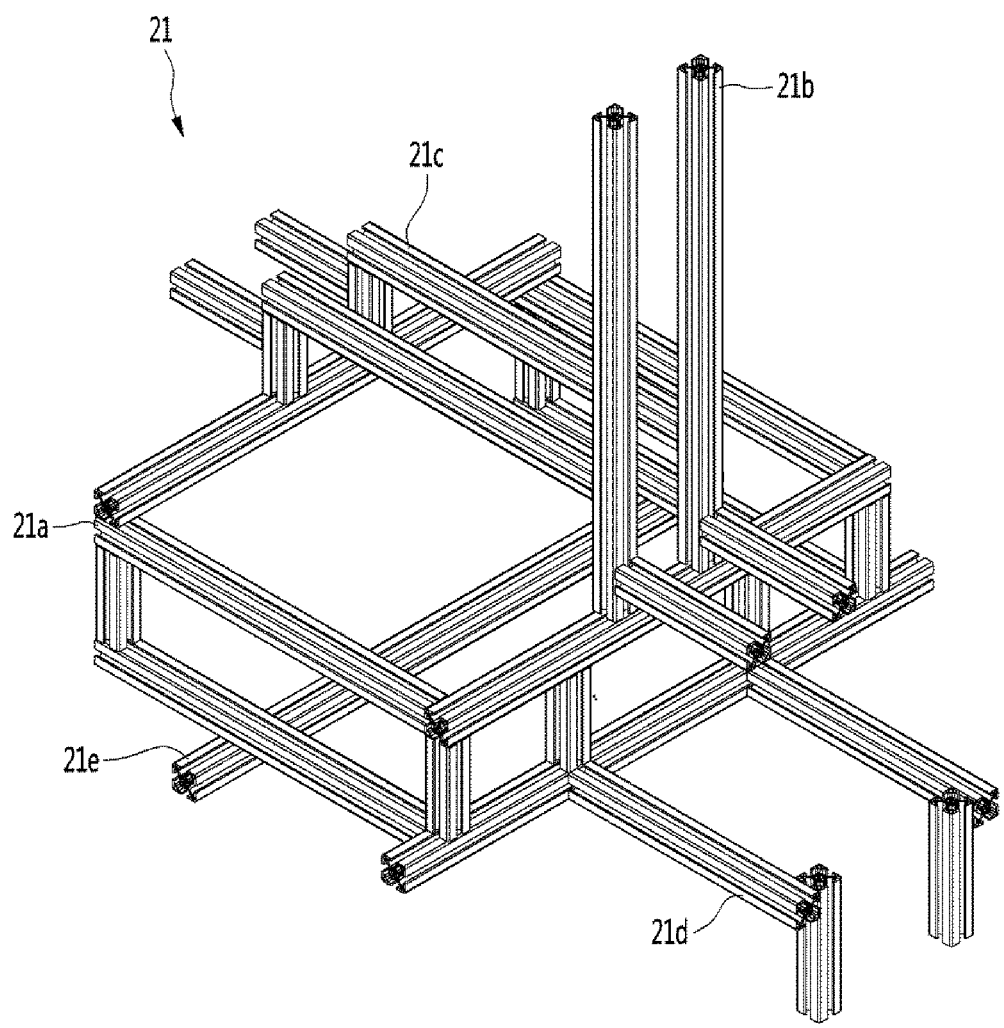
FIG. 4 is a diagram showing a fixed body included in a main body of a cleaning robot according to an embodiment of the present invention.

FIG. 4 is a perspective view showing a fixed body provided in a main body of a cleaning robot according to an embodiment of the present invention.

Referring to FIG. 4, the fixed body 21 may include a main fixed body 21a, a first upper fixed body 21b and a second upper fixed body 21c provided above the main fixed body 21a, a front fixed body 21d provided at the front side of the main fixed body 21a, and a lower fixed body 21e provided below the main fixed body 21a.

The main fixed body 21a may have a plurality of frames fastened to each other to form a three-dimensional structure having a predetermined volume and may form a basic frame of the main body 20. For example, as shown in FIG. 4, the main fixed body 21a may have a plurality of frames fastened to each other to have a rectangular parallelepiped shape but the shape of the main fixed body 21a is not limited to the rectangular parallelepiped shape. At least one plate may be fastened to the exterior of the main fixed body 21a and a battery 210 or a main board of the main body 20 may be provided in or above the main fixed body 21a.

The first upper fixed body 21b and the second upper fixed body 21c may be provided above the main fixed body 21a.

The first upper fixed body 21b may include at least one frame extending in a longitudinal direction, and the second upper fixed body 21c may include at least one frame extending in a lateral direction toward the front and rear sides of the cleaning robot 1. For example, the camera unit 24 may be fixed to the first upper fixed body 21b toward the front side of the cleaning robot 1. In addition, the cleaning module 29 of FIG. 2 may be seated in the second upper fixed body 21c. In some embodiments, the cleaning module 29 may be fastened to the first upper fixed body 21b and the second upper fixed body 21c, thereby being more stably fixed.

The front fixed body 21d may be provided at the front side of the main fixed body 21a. A second plate 212, to which an elastic setting part 23a described below with reference to FIG. 5 may be fastened, may be fastened to the front fixed body 21d. In some embodiments, a caster assisting traveling of the traveling parts 26 may be fastened to the lower part of the front fixed body 21d.

The lower fixed body 21e may be provided below the main fixed body 21a. The lower fixed body 21e may include at least one frame extending in a lateral direction toward both lateral sides of the cleaning robot 1. The traveling parts 26 and the suction module 27 may be fastened to the lower fixed body 21e. In some embodiments, the suction module 27 may be fastened to at least one of the main fixed body 21a, the front fixed body 21d, and the lower fixed body 21e.

Figure 5:
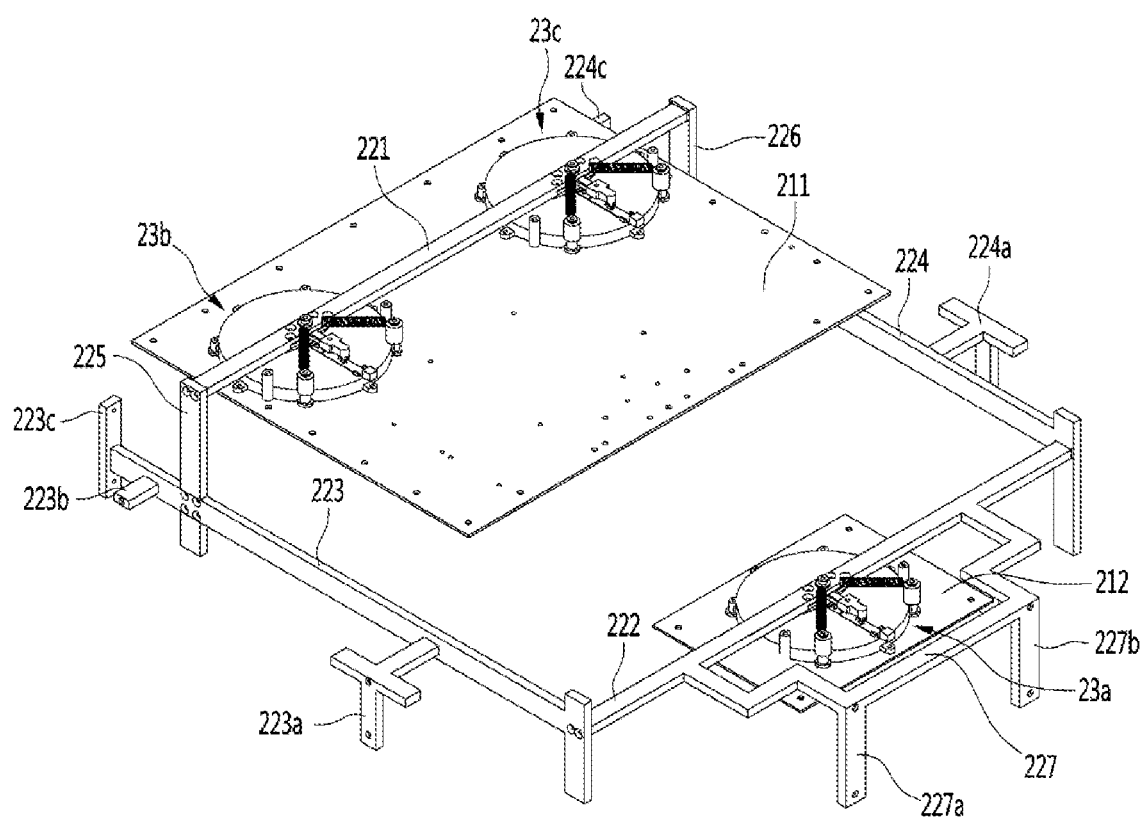
FIG. 5 is a perspective view showing a movement frame and components for fixing the movement frame to a fixed body of a cleaning robot according to an embodiment of the present invention.
Figure 6:
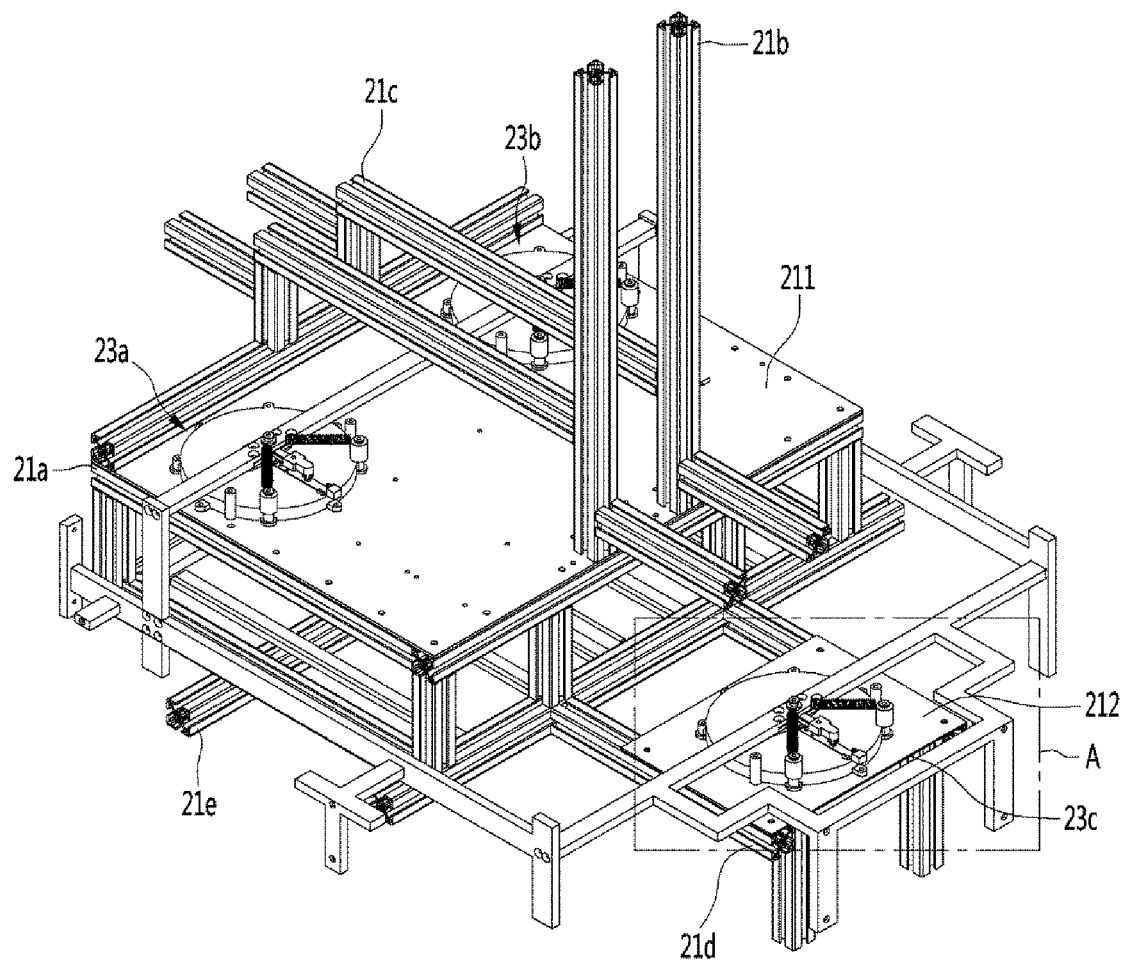
FIG. 6 is a diagram showing a movement frame and a fixed body.

FIG. 5 is a perspective view showing a movement frame and components for fixing the movement frame to a fixed body of a cleaning robot according to an embodiment of the present invention, and FIG. 6 is a perspective view showing a movement frame and a fixed body.

Referring to FIG. 5, the movement frame 22 may include a plurality of frames adjacent to the inner circumferential surface of the cover 10 (e.g., the bottom cover 10c) and located at front, rear and both lateral sides of the center of the cleaning robot 1. For example, the movement frame 22 may include a first frame 221 and a second frame 222 extending in a lateral direction toward both lateral sides of the cleaning robot 1 and a third frame 223 and a fourth frame 224 extending in a lateral direction toward the front and rear sides of the cleaning robot 1. For example, the first frame 221 may be located above the main fixed body 21a, and the second frame 222 may be located at the front side of the main fixed body 21a. In addition, the third frame 223 and the fourth frame 224 may be located at both lateral sides of the main fixed body 21a. In this case, although the movement frame 22 has a rectangular shape when viewed from the top, the shape of the movement frame 22 is not limited thereto.

In some embodiments, based on the arrangements of various components received in the bottom cover 10c and the shape of the fixed body 21, the movement frame 22 may be provided outside the fixed body 21 (specifically, the main fixed body 21a) so as not to be directly brought into contact with the above-described components and the fixed body 21. For example, the height of the first frame 221 from the ground may be different from the heights of the second frame 222 to the fourth frame 224 from the ground. As described below with reference to FIG. 6, the first frame 221 may be located above the main fixed body 21a and the second to fourth frames 222 to 224 may be provided at the front and both lateral sides of the main fixed body 21a. Therefore, the height of the first frame 221 from the ground may be greater than the heights of the second to fourth frames 222 to 224 from the ground.

In this case, the movement frame 22 may include a fifth frame 225 for connecting the first frame 221 and the third frame 223 and a sixth frame 226 for connecting the first frame 221 and the fourth frame 224. In this case, the movement frame 22 may have an "L" shape when viewed from one lateral side.

As in the embodiment shown in FIG. 5, when the movement frame 22 includes first to sixth frames 221 to 226, the first frame 221 may be fastened to the fifth frame 225 and the sixth frame 226, and the second frame 222 may be fastened to the third frame 223 and the fourth frame 224. The third frame 223 may be fastened to the second frame 222 and the fifth frame 225, and the fourth frame 224 may be fastened to the second frame 222 and the sixth frame 226.

In some embodiments, the bottom cover 10c may be formed such that the front side thereof protrudes as compared to the rear and both lateral sides thereof, in order to protect the side brush 15 or the suction module 27 provided at the front lower end of the fixed body 21 or to more efficiently protect the internal components upon colliding with a front obstacle. Therefore, the front side of the bottom cover 10c and the second frame 222 may be spaced apart from each other by a predetermined distance or more. In order to efficiently fasten the front side of the bottom cover 10c and the movement frame 22, the movement frame 22 may further include a seventh frame 227 formed at the front side of the second frame 222.

The movement frame 22 may be fastened to the bottom cover 10c at at least one fastening point. However, each of the frames 221 to 226 of the movement frame 22 and the bottom cover 10c are spaced apart from each other by a predetermined distance, such that each of the frames 221 to 226 may not be easily fastened to the bottom cover 10c.

Therefore, the movement frame 22 may further include one or more fastening frames 223a to 223c, 224a to 224c and 227a to 227b connected to any one of the frames 221 to 226, in order to be fastened to the bottom cover 10c.

For example, the first fastening frame 223a and the second fastening frame 223b may be connected to the third frame 223 toward the lateral side (e.g., right side) of the cleaning robot 1. The third fastening frame 223c may be connected to the third frame 223 toward the rear side of the cleaning robot 1. The fourth fastening frame 224a and the fifth fastening frame 224b may be connected to the fourth frame 224 toward the lateral side (e.g., left side) of the cleaning body 1, and the sixth fastening frame 224c may be connected to the fourth frame 224 toward the rear side of the cleaning robot 1. In addition, the seventh fastening frame 227a and the eighth fastening frame 227b may be connected to the seventh frame 227 toward the front side of the cleaning robot 1.

Meanwhile, the fastening frames may be formed at positions symmetrical to each other with respect to a virtual line connecting the front and rear sides of the cleaning robot 1. That is, the first fastening frame 223a and the fourth fastening frame 224a, the second fastening frame 223b and the fifth fastening frame 224b, the third fastening frame 223c and the sixth fastening frame 224c, and the seventh fastening frame 227a and the eighth fastening frame 227b may be formed at positions symmetrical to each other.

The movement frame 22 may be connected to the bottom cover 10c as the plurality of fastening frames 223a to 223c, 224a to 224c and 227a to 227b is fastened to the bottom cover 10c. An example of fastening the fastening frames 223a to 223c, 224a to 224c and 227a to 227b to the bottom cover 10c was described with reference FIG. 3.

Referring to FIGS. 5 and 6, the cleaning robot 1 may include one or more elasticity setting parts 23a to 23c connected to the movement frame 22. As shown in FIG. 5, the elasticity setting part may include a first elasticity setting part 23a connected to the second frame 222 and a second elasticity setting part 23b and a third elasticity setting part 23c connected to the first frame 221.

For example, the elasticity setting parts 23a to 23c may be provided in an acute-angled triangular shape and may be fixed to the fixed body 21 by a first plate 211, to which the second elasticity setting part 23b and the third elasticity setting part 23c are fastened, and a second plate 212, to which the first elasticity setting part 23a is fastened. In some embodiments, the first plate 211 and the second plate 212 may be understood as being included in the fixed body 21. For example, the first plate 211 may be fastened to the main fixed body 21a and the second plate 212 may be fastened to the front fixed body 21d. In this case, the first elasticity setting part 23a may be provided at the front side of the fixed body 21 (specifically, the main fixed body 21a), and the second elasticity setting part 23b and the third elasticity setting part 23c may be provided above the fixed body 21 to form the acute-angled triangle along with the first elasticity setting part 23a. As a result, the movement frame 22 is connected and supported at three points located in the acute-angled triangular shape of the fixed body 21, thereby stably supporting the cover 10 having a large volume and weight relative to the fixed body 21.

In addition, the elasticity setting parts 23a to 23c may enable the movement frame 22 to freely move relative to the fixed body 21. Therefore, even when the cover 10 and the movement frame 22 move by external force, the fixed body 21 may not move. To this end, the elasticity setting parts 23a to 23c may be connected to the movement frame 22 using an elastic member. This will be described in greater detail below with reference to FIG. 7. Meanwhile, as shown in FIG. 6, the movement frame 22 may be located outside the fixed body 21 (specifically, the main fixed body 21a) in order to avoid direct contact with the fixed body 21 upon movement. In particular, the movement frame 22 and the fixed body 21 may be spaced apart from each other by greater than a predetermined distance and the predetermined distance may correspond to a maximum movement distance of the movement frame 22 and the cover 10.

Figure 7:
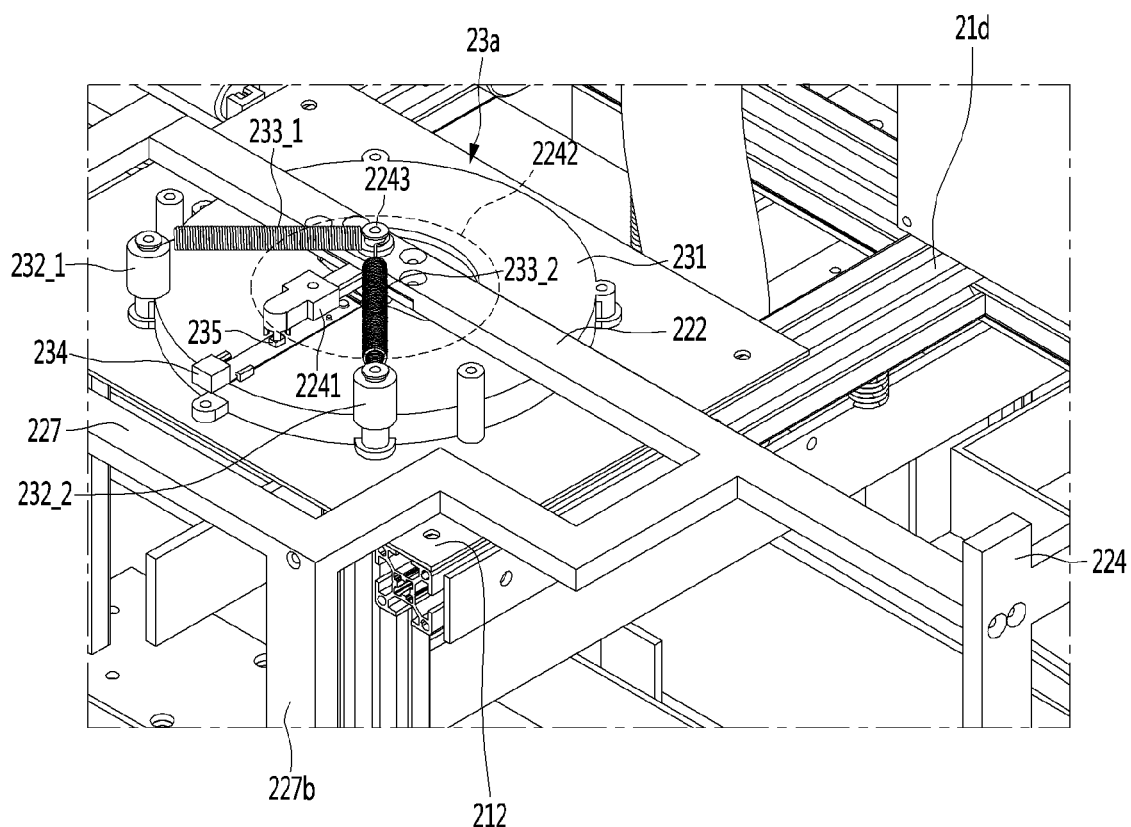
FIG. 7 is a perspective view of an elasticity setting part provided between a movement frame of a cleaning robot and a fixed body according to an embodiment of the present invention.
Figure 8:
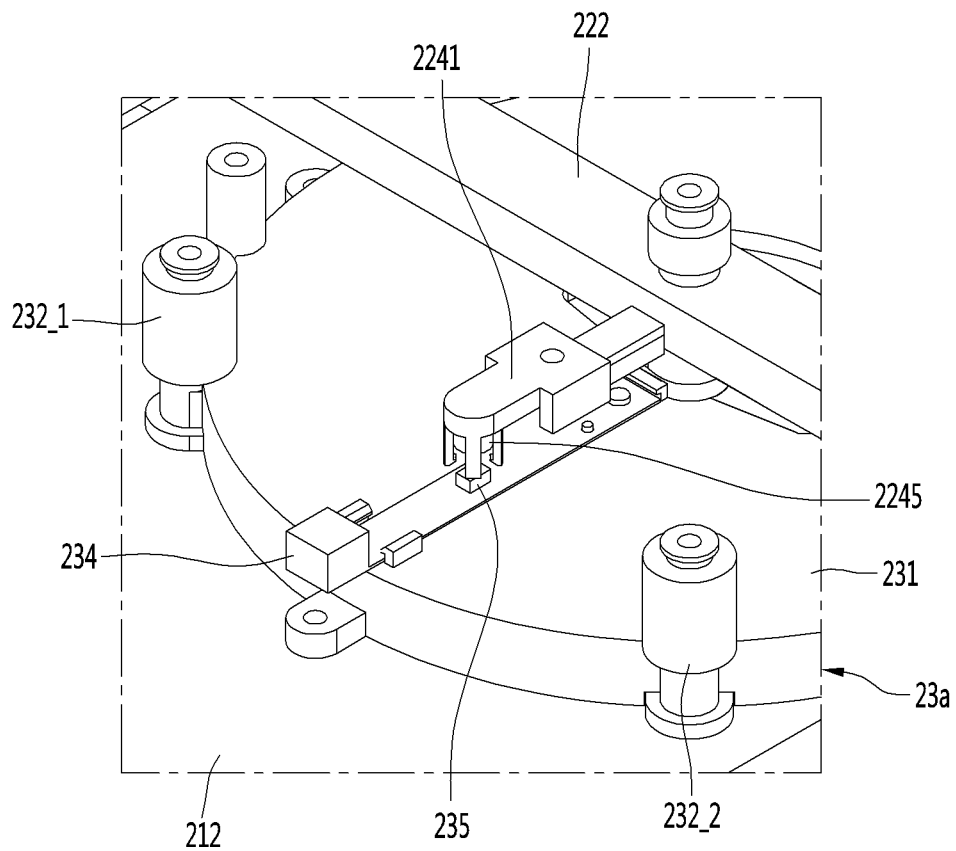
FIG. 8 is an enlarged view of a sensor module and a magnetic-material fixing part of the elasticity setting part shown in FIG. 7.

FIG. 7 is a perspective view of an elasticity setting part provided between a movement frame of a cleaning robot and a fixed body according to an embodiment of the present invention, and FIG. 8 is an enlarged view of a sensor module and a magnetic-material fixing part of the elasticity setting part shown in FIG. 7.

In the following figures, the configuration of the elasticity setting part 23 according to the embodiment of the present invention will be described using the first elasticity setting part 23a provided at the front side of the fixed body 21. However, the configuration of the elasticity setting parts 23b, 23c provided at the lateral rear sides of the fixed body 21 is substantially equal to that of the first elasticity setting part 23a provided at the front side of the fixed body 21.

Referring to FIG. 7, the movement frame 22 (the second frame 222 in the embodiment of FIG. 7) may include an inner body 2242 contacting the upper surface of the second plate 212 fastened to the front fixed body 21d and movably supporting the movement frame 22 relative to the fixed body 21. For example, the inner body 2242 may be implemented in a circular plate shape, without being limited thereto. The inner body 2242 may be located below the second frame 222. The inner body 2242 may be connected to the second frame 222 through a movement shaft 2243 vertically formed with respect to the second frame 222. That is, the movement shaft 2243 may connect the movement frame 22 and the inner body 2242. In this case, when the movement frame 22 moves by external force applied to the cover 10, the inner body 2242 may also move in a horizontal direction.

The first elasticity setting part 23a may include a holder 231 for enabling horizontal movement of the movement frame 22 and disabling vertical movement of the movement frame 22. The holder 231 may be fastened to the second plate 212 of the fixed body 21. A reception space for receiving the inner body 2242 may be formed in the holder 231, and the inner body 2242 may be horizontally moved in the reception space. In order for the inner body 2242 to move in the reception space, the size of the reception space may be greater than that of the inner body 2242.

The holder 231 may include a stopper formed at the upper portion of the reception space. The inner body 2242 received in the reception space may be connected to the movement frame 22 through the movement shaft 2243 passing through the stopper. At this time, in order to prevent the inner body 2242 from escaping from the holder 231, the size of the stopper may be less than that of the inner body 2242. The stopper may be formed to fix the movement frame 22 at a reference position when external force is not applied. In addition, the movement ranges of the bottom cover 10c and the movement frame 22 may be set according to the size of the stopper. As the size of the stopper increases, the movement range of the movement frame 22 may increase and, as the size of the stopper decreases, the movement range of the movement frame 22 may decrease.

In some embodiments, the movement ranges of the movement frame 22 and the bottom cover 10c may be set according to the size of the reception space. As the size of the reception space increases, the movement ranges of the bottom cover 10c and the movement frame 22 may increase and, as the size of the reception space decreases, the movement ranges of the bottom cover 10c and the movement frame 22 may decrease.

In addition, the first elasticity setting part 23a may further include elastic members 233_1 to 233_2 to connect the holder 231 and the second frame 222. One ends of the elastic members 233_1 to 233_2 may be connected to spring connection bodies 232_1 and 232_2 coupled to the holder 231 or the edge of the holder 231, and the other ends thereof may be connected to the second frame 222 or the movement shaft 2243 connected to the second frame 222.

The elastic members 233_1 to 233_2 may be returned to the reference position after the movement frame 22 moves by external force. For example, the elastic members 233_1 to 233_2 may be implemented by tension springs.

As shown in FIG. 7, the elasticity setting part 23 may include the first elastic member 233_1 and the second elastic member 233_2. One end of the first elastic member 233_1 may be connected to the first spring connection body 232_1 and the other end thereof may be connected to the movement shaft 2243. One end of the second elastic member 233_2 may be connected to the second spring connection body 232_2 and the other end thereof may be connected to the movement shaft 2243.

The first elastic member 233_1 and the second elastic member 233_2 may be formed at a predetermined angle from the movement shaft 2243. The first elastic member 233_1 may pull the movement shaft 2243 forward and to one side and the second elastic member 233_2 may pull the movement shaft 2243 forward and to the other side. The elastic force of the first elastic member 233_1 may be equal to that of the second elastic member 233_2.

As a result, when external force is not applied to the bottom cover 10c, the movement shaft 2243 may be located at the reference position between the first elastic member 233_1 and the second elastic member 233_2 by a combination of elastic forces of the first elastic member 233_1 and the second elastic member 233_2.

Meanwhile, when the bottom cover 10c and the movement shaft 2243 move to one side of the robot by external force, the elastic member located at the other side of the robot may be stretched. As a result, since elastic force applied from the elastic member located at the other side of the robot further increases, the movement shaft 2243 may be returned to the reference position again. That is, the movement shaft 2243 may be stably returned to the reference position even when moving to the rear side or to the lateral sides of the cleaning robot 1.

When the bottom cover 10c moves by collision with an obstacle or by external force, the elastic members 233_1 to 233_2 may be stretched to absorb external force when the movement frame 22 moves. Accordingly, the external force applied to the fixed body 21 may be minimized. In addition, the elastic members 233_1 to 233_2 may be compressed after being stretched and the cover 10 and the movement frame 22 may be returned to the reference position.

Although the elasticity setting part 23 includes two elastic members 233_1 to 233_2 in FIG. 7, the number of elastic members may be changed according to embodiment. In addition, the elastic member may be implemented by various components (e.g., a damper, etc.) for returning the movement frame 22 to a specific position instead of the restoration spring.

Referring to FIGS. 7 and 8, the sensor module 234 includes a sensor 235 for sensing movement of the movement frame 22 or escaping of the movement frame 22 from the reference position and may be provided on the holder 231. For example, the sensor 235 may be implemented by a Hall sensor. The Hall sensor may mean a sensor for sensing change in magnetic field using the Hall effect.

The cleaning robot 1 may sense movement of the movement frame 22 using the Hall sensor 235 and sense that an obstacle collides with the cover 10 or external force is applied to the cover 10 based on the sensed result. To this end, the movement frame 22 or the second frame 222 may be connected to a magnetic-material fixing part 2241 for fixing a magnetic material 2245 for generating a magnetic field, such that the magnetic material 2245 may be connected to the movement frame 22. For example, the magnetic-material fixing part 2241 may extend to the front side of the movement frame 22 to fix the magnetic material 2245.

When the cover 10 and the movement frame 22 do not move, the magnetic material 2245 fixed to the magnetic-material fixing part 2241 may be located at the vertically upper side of the Hall sensor 235. As the magnetic material 2245 is located at the vertically upper side of the Hall sensor 235, the Hall sensor 235 may be located close to the magnetic material 2245. Accordingly, upon sensing change in magnetic field of the Hall sensor 235, sensing of change in magnetic field due to an element other than the magnetic material 2245 can be minimized.

When the cover 10 and the movement frame 22 move, the magnetic material 2245 and the magnetic-material fixing part 2241 connected to the movement frame 22 may also move. Therefore, the magnetic material 2245 may be shifted from the vertical upper side of the Hall sensor 235 and thus the magnetic material 2245 may be separated from the vertical upper side of the Hall sensor 235, the magnetic field may be changed by movement of the magnetic material 2245. The Hall sensor 235 may sense change in magnetic field and a controller of the cleaning robot 1 may determine that the cover 10 and the movement frame 22 move based on the sensed result of the Hall sensor 235.

In some embodiments, if a plurality of Hall sensors is included in the sensor module 234, the controller of the cleaning robot 1 may determine the movement direction of the cover 10 and the movement frame 22 based on the sensed result of the plurality of Hall sensors. The controller may acquire information on a direction in which external force is applied, by determining the movement direction of the cover 10 and the movement frame 22.

Hereinafter, operation for sensing external force applied to the cleaning robot 1 will be described with reference to FIGS. 9 to 13.

Figure 9:
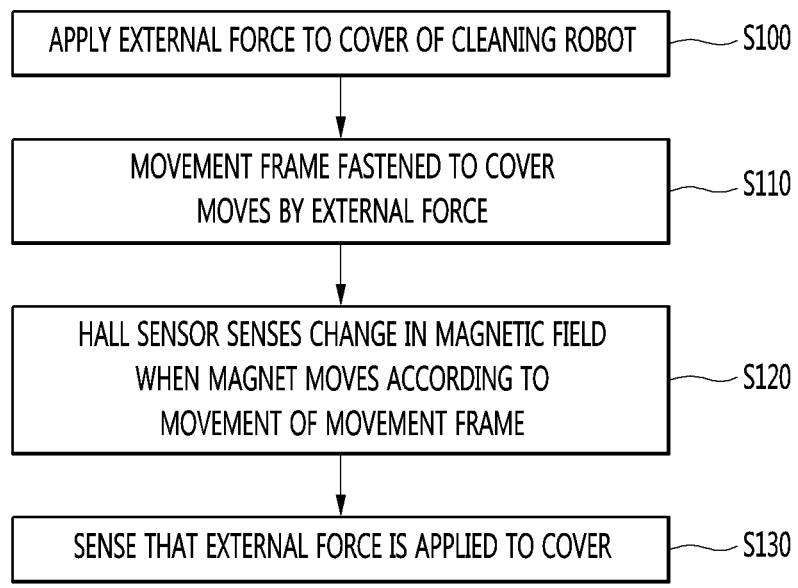
FIG. 9 is a flowchart illustrating operation for sensing external force applied to a cleaning robot according to an embodiment of the present invention.

FIG. 9 is a flowchart illustrating operation for sensing external force applied to a cleaning robot according to an embodiment of the present invention.

Referring to FIG. 9, external force may be applied to the cover 10 of the cleaning robot 1 (S100). The external force may be applied when various obstacles collide with the cleaning robot 1 or when a person pushes the cover 10. In the embodiment of FIG. 9, the cover 10, to which external force is applied, may correspond to the bottom cover 10c, without being limited thereto.

By the external force applied in step S100, the cover 10 of the cleaning robot 1 and the movement frame 22 connected to the cover 10 may move (S110). The movement direction of the cover 10 and the movement frame 22 may correspond to the opposite direction of the direction in which the external force is applied. For example, when external force is applied to the front side of the cleaning robot 1, the cover 10 and the movement frame 22 may move to the rear side of the cleaning robot 1. Meanwhile, when external force is applied to one side of the cleaning robot 1, the cover 10 and the movement frame 22 may move to the other side of the cleaning robot 1.

When the movement frame 22 moves, the magnetic material 2245 fixed to the magnetic-material fixing part 2241 connected to the movement frame 22 may also move. The magnetic field may be changed by movement of the magnetic material 2245 and the Hall sensor 235 may sense change in magnetic field (S120).

As the Hall sensor 235 senses change in magnetic field, the cleaning robot 1 may determine that external force is applied to the cover 10 (S130). The controller may control the traveling properties of the cleaning robot 1, that is, may stop traveling of the cleaning robot 1, decrease a traveling speed, or change a traveling direction, upon determining that external force is applied.

In some embodiments, if the sensor module 234 includes a plurality of Hall sensors, the controller may acquire information on a direction of external force based on sensing results from the plurality of Hall sensors. When information on the direction of external force is acquired, the controller may control the traveling properties of the cleaning robot 1 based on the direction of applied external force. For example, when external force is applied to the front side of the cleaning robot 1, the controller may change the traveling direction of the cleaning robot 1 to the rear direction.

Figure 10:
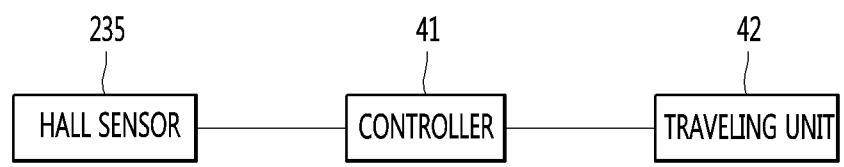
FIG. 10 is a schematic block diagram showing the configuration of a cleaning robot for performing the embodiment shown in FIG. 9.

FIG. 10 is a schematic block diagram showing the configuration of a cleaning robot for performing the embodiment shown in FIG. 9.

Referring to FIG. 10, the cleaning robot 1 may include a Hall sensor 235, a controller 41 and a traveling unit 42.

The controller 41 may control operation of various components included in the cleaning robot 1. The controller 41 may process signals or data received from the sensor unit 11 of the cleaning robot 1, the at least one camera 24 or the lidar sensor 25.

In particular, the controller 41 may recognize that external force is applied to the cover 10 based on a change in magnetic field sensed by the Hall sensor 235. In some embodiments, if the sensor module 234 includes a plurality of Hall sensors, the controller 41 may determine the direction of the external force based on change in magnetic field sensed by the plurality of Hall sensors. Based on the sensed result, the controller 41 may control the traveling unit 42 to change the traveling properties (e.g., the traveling speed, direction, etc.) of the cleaning robot 1. The controller 41 may be implemented by a microcomputer, a MCU, a CPU, an application processor, etc.

The traveling unit 42 may change the traveling properties of the cleaning robot 1 under control of the controller 41. Here, the traveling unit 42 may include the traveling parts 26 (wheels, etc.) described above with reference to FIG. 2 and a driving unit for controlling driving of the traveling parts 26. The traveling properties may include a traveling speed and a traveling direction.

Figure 11:
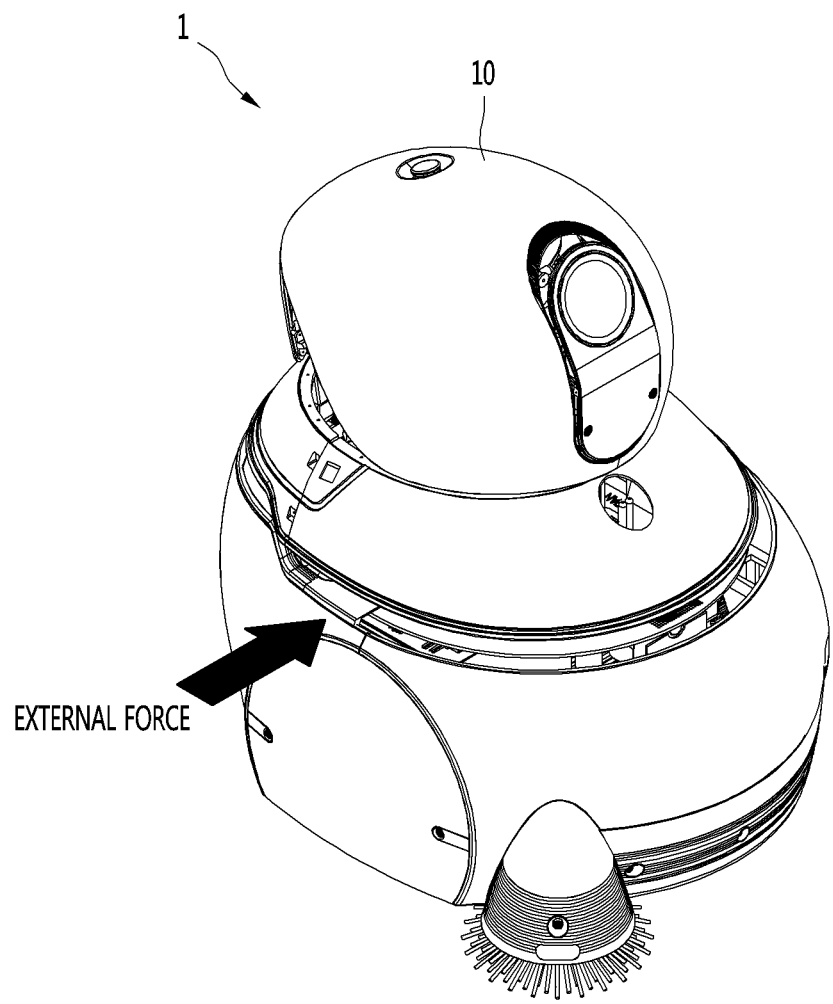
FIGS. 11 to 13 are diagrams illustrating operation of a movement frame and an elasticity setting part included in a cleaning robot upon applying external force to the cleaning robot.
Figure 12:
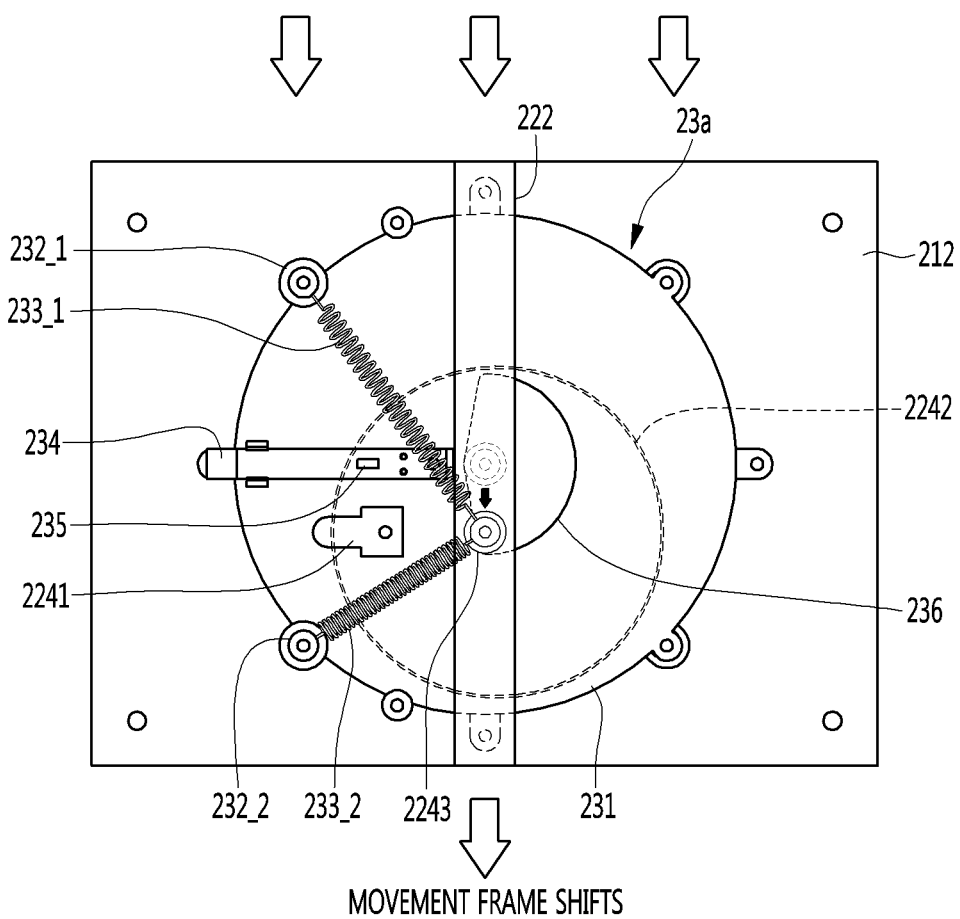
Figure 13:
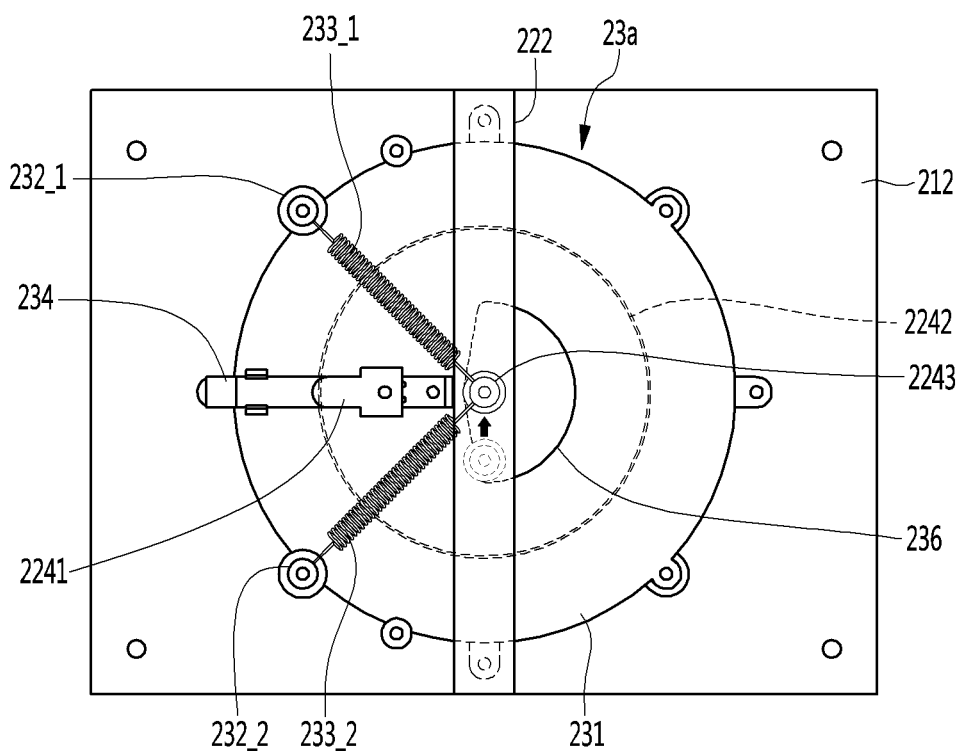

FIGS. 11 to 13 are diagrams illustrating operation of a movement frame and an elasticity setting part included in a cleaning robot upon applying external force to the cleaning robot.

Referring to FIGS. 11 and 12, while the cleaning robot 1 travels or stops, external force may be applied to the cleaning robot 1 in one direction (e.g., right direction) (e.g., an obstacle collides with the right side of the cleaning robot 1, etc.).

In this case, the cover 10 may move to the left by the applied external force. Since the cover 10 moves to the left, the movement frame 22 connected to the cover 10 may also move to the left. Since the movement frame 22 moves to the left, the movement shaft 2243 connected to the movement frame 22 and the inner body 2242 may also move to the left. Therefore, at least one 233_1 of the elastic members 233_1 and 233_2 having one end connected to the movement shaft 2243 may be stretched by the external force, but the fixed body 21 connected to the elastic members 233_1 and 233_2 may not be moved.

In addition, the magnetic-material fixing part 2241 connected to the movement frame 22 and the magnetic material 2245 fixed to the magnetic-material fixing part 2241 may move to the left. The magnetic field may be changed according to movement of the magnetic material 2245 and the Hall sensor 235 may sense change in magnetic field. Based on the sensed result of the Hall sensor 235, the controller 41 of the cleaning robot 1 may determine or recognize movement of the cover 10 due to external force, that is, collision with an obstacle or application of external force.

Referring to FIG. 13, when external force is applied to the cleaning robot 1 as shown in FIGS. 11 and 12, at least one 233_1 of the elastic members 233_1 and 233_2 may be stretched and the movement frame 22 and the components connected thereto may move.

When external force is no longer applied, the stretched elastic member 233_1 may be compressed. As the elastic members 233_1 and 233_2 are compressed, the movement shaft 2243 included in the movement frame 22 may be returned to the reference position. Therefore, the movement frame 22, the inner body 2242 and the cover 10 may also be returned to the reference position. In addition, the magnetic-material fixing part 2241 connected to the movement frame 22 and the magnetic material 2245 may also be returned to the reference position. As a result, the magnetic material 2245 may be located at the vertically upper side of the Hall sensor 235.

When the cover 10 and the movement frame 22 do not move in a state of being returned to the reference position, the magnetic material 2245 may not move. Since the magnetic field is no longer changed, the Hall sensor 235 may not sense change in magnetic field. The controller 41 may determine that external force is no longer applied to the cleaning robot, when change in magnetic field is not sensed for a predetermined time or more. In some embodiments, the controller 41 may control the traveling unit 42 such that the traveling properties of the cleaning robot 1 to the traveling properties before applying external force.

That is, the cleaning robot 1 according to the embodiment of the present invention may include the elasticity setting part 23 provided between the cover 10 (or the movement frame 22) and the fixed body 21 to connect the cover 10 and the fixed body 21 and to support the cover 10 relative to the fixed body 21. In particular, the cleaning robot 1 may sense change in magnetic field due to the magnetic material moving in correspondence with the cover 10, using the Hall sensor included in the elasticity setting part 23. Based on the sensed result, the cleaning robot 1 may recognize collision with an obstacle or application of external force. By recognizing collision with an obstacle or application of external force to change the traveling properties, the cleaning robot 1 can efficiently prevent the various components included in the main body 20 from being damaged or broken.

The cleaning robot according to the embodiment of the present invention may include the Hall sensor for sensing change in magnetic field due to the magnetic material moving in correspondence with movement of the cover, thereby more accurately sensing movement of the cover. The cleaning robot may recognize collision with an obstacle and application of external force and change traveling properties, by sensing movement of the cover. Therefore, the cleaning robot may avoid re-collision with the obstacle or continuous application of external force, thereby efficiently preventing various components included in the main body of the robot from being damaged or broken. In addition, when a person collides with the cleaning robot in the traveling direction, the cleaning robot may change the traveling direction or reduce the speed, thereby preventing the person from falling over the cleaning robot or being injured by the cleaning robot. Accordingly, it is possible to further improve stability and reliability of the robot.

What is claimed is:

1. A robot comprising:
   a fixed body;
   a traveling part provided at a lower portion of the fixed body to enable the robot to move along a floor surface;
   a cover surrounding the fixed body, the cover being configured to receive an external force;
   a movement frame supporting the cover, the movement frame being movable horizontally with respect to the fixed body;
   at least one elasticity setting part provided between the movement frame and the fixed body to support the movement frame relative to the fixed body, and to permit limited movement of the cover with respect to the fixed body; and
   a sensor configured to sense movement of the movement frame,
   wherein the at least one elasticity setting part includes a holder fastened to the fixed body for disabling vertical movement of the movement frame, wherein the sensor includes a Hall effect sensor directly fixed to the holder, and a magnetic material connected to the movement frame and vertically spaced from the Hall effect sensor, wherein the holder includes a reception space for receiving an inner body, and an opening formed at an upper portion of the reception space, wherein the inner body is connected to the movement frame through the opening, and wherein a width of the opening is smaller than a width of the inner body.

2. The robot according to claim 1, wherein the traveling part comprises a plurality of wheels.

3. The robot according to claim 1, further comprising:
a suction part provided at the fixed body to suck foreign materials from the floor surface; and
a side brush protruding from a front lower end of the cover.

4. The robot according to claim 1, further comprising a magnetic-material fixing part extending from a lateral side of the movement frame to fix the magnetic material to the movement frame.

5. The robot according to claim 4, wherein the magnetic-material fixing part positions the magnetic material at a vertically upper side of the Hall effect sensor.

6. The robot according to claim 1, wherein the magnetic material moves adjacent to an upper side of the Hall effect sensor when the cover moves by the external force.

7. The robot according to claim 1, further comprising a controller configured to recognize that the external force is applied to the cover based on a sensed result of the sensor,
wherein the controller controls the traveling unit to change traveling properties of the robot when the external force is applied.

8. The robot according to claim 1, wherein the cover forms an external appearance of the robot.

9. The robot according to claim 1, wherein the at least one elasticity setting part comprises:
a plate provided on the fixed body;
an inner body contacting an upper surface of the plate; and
a movement shaft connecting the movement frame to the inner body,
wherein the inner body is horizontally movable with respect to the plate.

10. The robot according to claim 9, wherein the inner body horizontally moves according to external force applied to the cover.

11. The robot according to claim 9, wherein the at least one elasticity setting part includes:
a first elasticity setting part provided at a front side of the fixed body;
a second elasticity setting part provided at a left rear portion of the fixed body; and
a third elasticity setting part provided at a right rear portion of the fixed body,
wherein the first, second and third elasticity setting parts are arranged in a triangular shape.

12. The robot according to claim 11, wherein each of the first, second and third elasticity setting parts comprises:
a first elastic member connected between the movement frame and the fixed body for biasing the movement frame in a first direction; and
a second elastic member connected between the movement frame and the fixed body for biasing the movement frame in a second direction.

13. The robot according to claim 11, wherein the first elasticity setting part comprises:
a first plate portion provided at a front portion of the fixed body;
a first inner body contacting an upper surface of the first plate portion; and
a first movement shaft connecting the movement frame to the first inner body,
wherein the second elasticity setting part comprises:
a second plate portion provided at a left rear portion of the fixed body;
a second inner body contacting an upper surface of the second plate portion; and
a second movement shaft connecting the movement frame to the second inner body,
wherein the third elasticity setting part comprises:
a third plate portion provided at a right rear portion of the fixed body;
a third inner body contacting an upper surface of the third plate portion; and
a third movement shaft connecting the movement frame to the third inner body, and
wherein the first, second and third inner bodies are arranged in a triangular shape.

14. The robot according to claim 1, wherein the at least one elasticity setting part further comprises:
a first elastic member connected between the movement frame and the fixed body for biasing the movement frame in a first direction; and
a second elastic member connected between the movement frame and the fixed body for biasing the movement frame in a second direction.

15. The robot according to claim 14, wherein the second direction is different from the first direction.

16. The robot according to claim 14, wherein vector components of forces provided by the first elastic member and the second elastic member sum together in a front-to-rear direction of the robot so that the movement frame is biased toward a front of the robot, and offset each other in a side-to-side direction of the robot so that the movement frame is biased toward an intermediate position between a right side and a left side of the robot.

17. A robot comprising:
a fixed body;
a traveling part provided at a lower portion of the fixed body to enable the robot to move along a floor surface;
a cover surrounding the fixed body, the cover being configured to receive an external force;
at least one elasticity setting part provided between the cover and the fixed body to support the cover relative to the fixed body, and to permit limited horizontal movement of the cover with respect to the fixed body, the at least one elasticity setting part comprising a sensor for sensing movement of the cover,
wherein the at least one elasticity setting part includes a holder fastened to the fixed body for disabling vertical movement of the movement frame,
wherein the sensor includes a Hail effect sensor directly fixed to the holder, and a magnetic material connected to the cover and vertically spaced from the Hail effect sensor,
wherein the holder includes a reception space for receiving an inner body, and an opening formed at an upper portion of the reception space,
wherein the inner body is connected to the movement frame through the opening, and
wherein a width of the opening is smaller than a width of the inner body.

18. A robot comprising:

a fixed body;

a plurality of wheels provided at a lower portion of the fixed body to enable the robot to move along a floor surface;

a cover surrounding the fixed body, the cover being configured to receive an external force;

a movement frame supporting the cover, the movement frame being movable horizontally with respect to the fixed body;

at least one elasticity setting part provided between the movement frame and the fixed body to support the movement frame relative to the fixed body, and to permit limited movement of the cover with respect to the fixed body, the at least one elasticity setting part comprising:

- a plate provided on the fixed body;
- an inner body contacting an upper surface of the plate;
- a holder fastened to the fixed body and having a reception space for accommodating the inner body and disabling vertical movement of the movement frame;
- a movement shaft connecting the movement frame to the inner body;
- a first elastic member connected between the movement frame and the fixed body for biasing the movement frame in a first direction; and
- a second elastic member connected between the movement frame and the fixed body for biasing the movement frame in a second direction;

a sensor configured to sense movement of the movement frame; and a controller configured to recognize that the external force is applied to the cover based on a sensed result of the sensor, wherein the controller controls the plurality of wheels to change traveling properties of the robot when the external force is applied, wherein the sensor includes a Hall effect sensor directly fixed to the holder, and a magnetic material connected to the cover and vertically spaced from the Hall effect sensor, wherein the holder includes an opening formed at an upper portion of the reception space, wherein the movement shaft passes through the opening to connect the inner body to the movement frame, and wherein a width of the opening is smaller than a width of the inner body.

* * * * *